(12) United States Patent
Trombert (10) Patent No.: US 12,061,214 B2
(45) Date of Patent: Aug. 13, 2024

(54) METHOD OF REDUCING NOISE IN A FLUXGATE CURRENT TRANSDUCER

(71) Applicant: LEM INTERNATIONAL SA, Plan-les-Ouates (CH)

(72) Inventor: Stephan Trombert, Leschaux (FR)

(73) Assignee: LEM INTERNATIONAL SA, Meyrin (CH)

( * ) Notice: Subject to any disclaimer, the term of this patent is extended or adjusted under 35 U.S.C. 154(b) by 193 days.

(21) Appl. No.: 17/630,716

(22) PCT Filed: Jul. 20, 2020

(86) PCT No.: PCT/EP2020/070436
§ 371 (c)(1),
(2) Date: Jan. 27, 2022

(87) PCT Pub. No.: WO2021/018650
PCT Pub. Date: Feb. 4, 2021

(65) Prior Publication Data
US 2022/0260613 A1 Aug. 18, 2022

(30) Foreign Application Priority Data
Jul. 31, 2019 (EP) ..................... 19189335

(51) Int. Cl.
*G01R 15/18* (2006.01)
*G01R 33/04* (2006.01)
(52) U.S. Cl.
CPC ........... *G01R 15/185* (2013.01); *G01R 33/04* (2013.01)
(58) Field of Classification Search
CPC ... G01R 15/185; G01R 33/04; G01R 33/0041
See application file for complete search history.

(56) References Cited

U.S. PATENT DOCUMENTS

| 6,218,831 B1 * | 4/2001 | Fowler | .................. G01R 33/04 324/228 |
| 2007/0170916 A1 | 7/2007 | Beranger | |

(Continued)

FOREIGN PATENT DOCUMENTS

| JP | H0694817 | 4/1994 |
| JP | 2013205180 | 10/2013 |
| WO | 2018/115032 | 6/2018 |

OTHER PUBLICATIONS

International Search Report and Written Opinion issued by the International Searching Authority, dated Oct. 7, 2020, for International Patent Application No. PCT/EP2020/070436; 16 pages.

*Primary Examiner* — Akm Zakaria
(74) *Attorney, Agent, or Firm* — Faegre Drinker Biddle & Reath LLP (57) ABSTRACT

Fluxgate current transducer including a fluxgate device comprising a saturable soft magnetic core and an excitation coil, and a processing circuit comprising a control circuit and a voltage generator connected to the control circuit for generating an alternating current in the excitation coil, the voltage generator generating a voltage oscillating between a maximum positive voltage (+Umax) and a maximum negative voltage (−Umax) configured to alternatingly saturate the soft magnetic core. The control circuit is configured to generate a voltage having an absolute value of amplitude less than an absolute value of said maximum positive voltage (+Umax) and said maximum negative voltage (−Umax) voltage during a variable time window (Tn, Tn+1, Tn+2, Tn+3) after detection of the excitation coil current reaching a threshold current (S3) representative of saturation of the magnetic core during at least a subset of a plurality of alternating voltage periods (P).

15 Claims, 5 Drawing Sheets

(56) References Cited

U.S. PATENT DOCUMENTS

| | | | |
|---|---|---|---|
| 2008/0046214 A1 | 2/2008 | Fowler | |
| 2009/0315536 A1* | 12/2009 | Koch | G01R 19/20 |
| | | | 324/117 R |
| 2011/0006753 A1 | 1/2011 | Yu | |
| 2014/0055131 A1* | 2/2014 | Rybalko | G01R 33/02 |
| | | | 324/253 |
| 2015/0293153 A1* | 10/2015 | Boettcher | H02H 1/0007 |
| | | | 324/117 R |
| 2019/0260283 A1* | 8/2019 | Rommel | H02M 1/00 |

* cited by examiner

METHOD OF REDUCING NOISE IN A FLUXGATE CURRENT TRANSDUCER

CROSS-REFERENCE TO RELATED APPLICATIONS

The present application is a national stage entry of International (PCT) Patent Application Number PCT/EP2020/070436, filed Jul. 20, 2020, which claims priority to European Patent Application Number 19189335.3, filed Jul. 31, 2019, the complete disclosures of which are expressly incorporated herein by reference.

The present invention relates to a fluxgate current transducer and a method of operating a fluxgate current transducer.

Fluxgate current transducers are well known and used in many current sensing applications. A fluxgate current transducer typically comprises a magnetic field detector having a saturable soft magnetic core 4 surrounded by an excitation coil 6 with Ne windings (see FIG. 1). The excitation coil is magnetically coupled to a compensation coil or measurement coil 8 having Nm windings. This arrangement has the characteristics of a transformer. In many fluxgate transducers, a primary conductor carrying a current to be measured extends through the central passage of the magnetic field detector. In closed-loop transducers, there is a compensation coil magnetically coupled to the magnetic field detector and connected in a feedback circuit to a signal processing circuit, the compensation coil seeking to cancel the magnetic field generated by the primary conductor. Such an arrangement is well known. It is also possible to use the fluxgate in an open-loop manner whereby there is no compensation coil and only a primary conductor carrying the current to be measured (represented by the measurement coil 8). In view of the high sensitivity of fluxgate magnetic field detectors, they are however mainly used in a closed-loop configuration.

Figures 1, 2A, 2B:
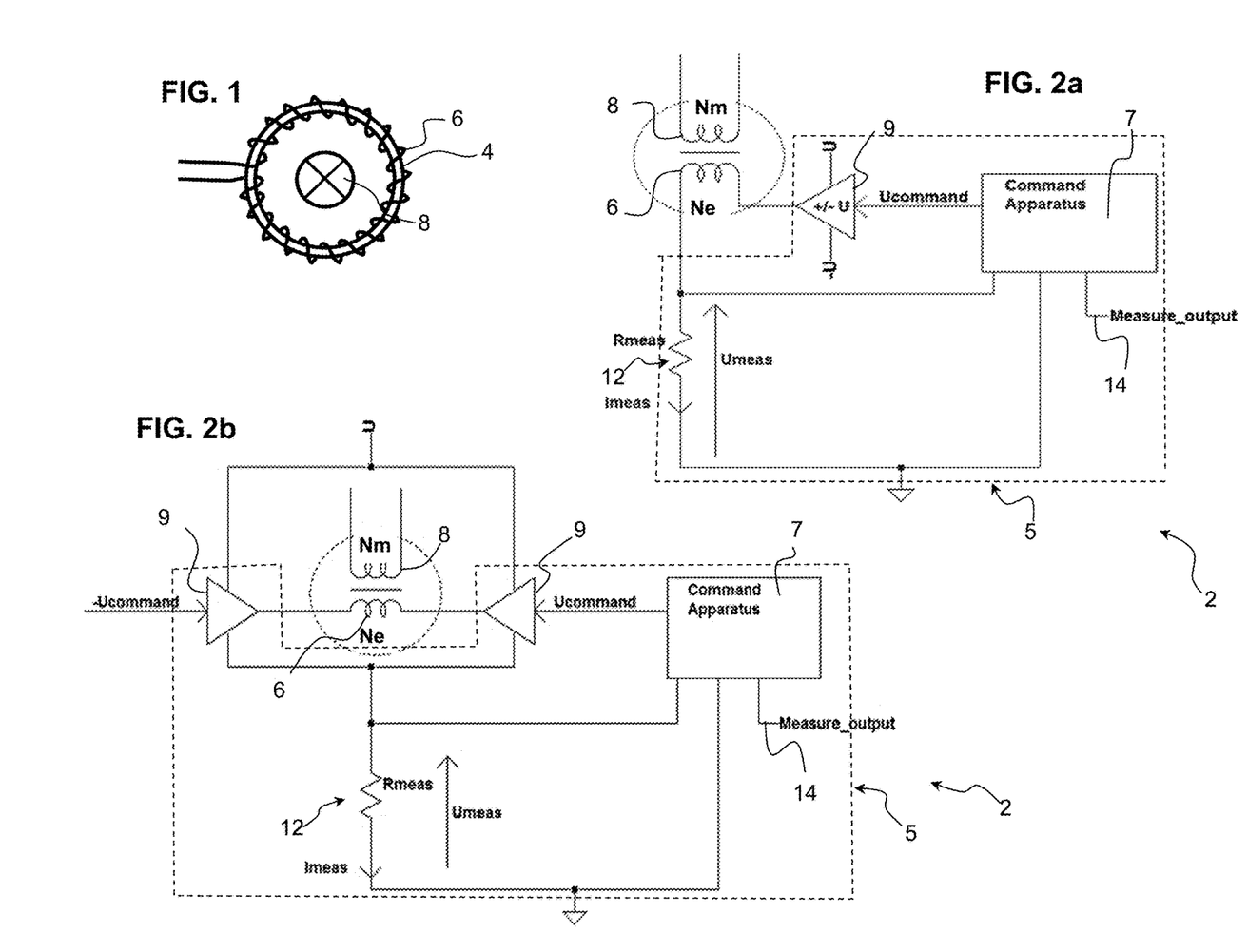
FIG. 1 is a schematic simplified view of a conventional fluxgate measuring head of a fluxgate current transducer.
FIGS. 2a and 2b show schematic circuit diagrams of conventional fluxgate current transducers.

Various circuit configurations are known for a fluxgate current transducer as illustrated for instance in FIGS. 2a and 2b. Typically, such transducers comprise a control circuit 7 that generates a voltage control output 10 to a voltage generator 9 that outputs a substantially square oscillating excitation coil voltage. The substantially square or trapezoidal voltage signal oscillates between a maximum negative value −U'max and a maximum positive value +U'max as illustrated in FIG. 3.

The excitation coil voltage alternatingly saturates the soft magnetic core 4 of the fluxgate device 3, whereby the saturation affects the timing t1', t2' of a duty cycle. A magnetic field, such as produced by the primary conductor carrying a current to be measured, causes the saturable soft magnetic core to saturate in one direction quicker than in the other direction, thus causing an asymmetry in the duration of the positive and negative voltage signals. The duration of the timing t1'/t2' provides a measurement of the amplitude of the external magnetic field and thus can be used to determine the amplitude and direction of the current to be measured. Such principles are well known.

Figure 3:
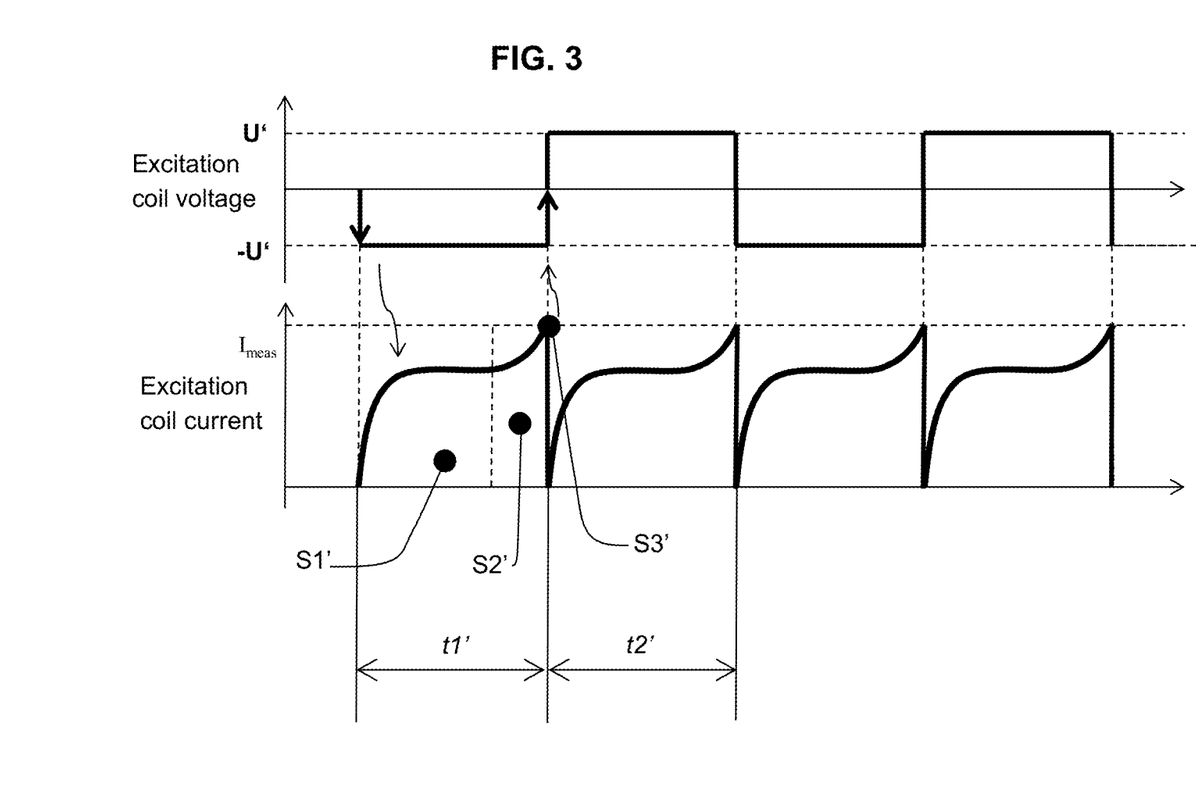
FIG. 3 shows plots of voltage, respectively current, over time in an excitation coil of a conventional fluxgate current transducer.

As best seen with reference to FIG. 3 which depicts the absolute value (positive value) of the excitation coil current for an external field that is substantially 0, during the initial stage S1' of a half period, the excitation coil current Imeas is rising until the stage S2' where the magnetic core goes into saturation until a threshold point S3' where the control circuit detects a threshold saturation and reverses the voltage of the voltage generator 9 supplying the excitation coil 6.

Figure 4:
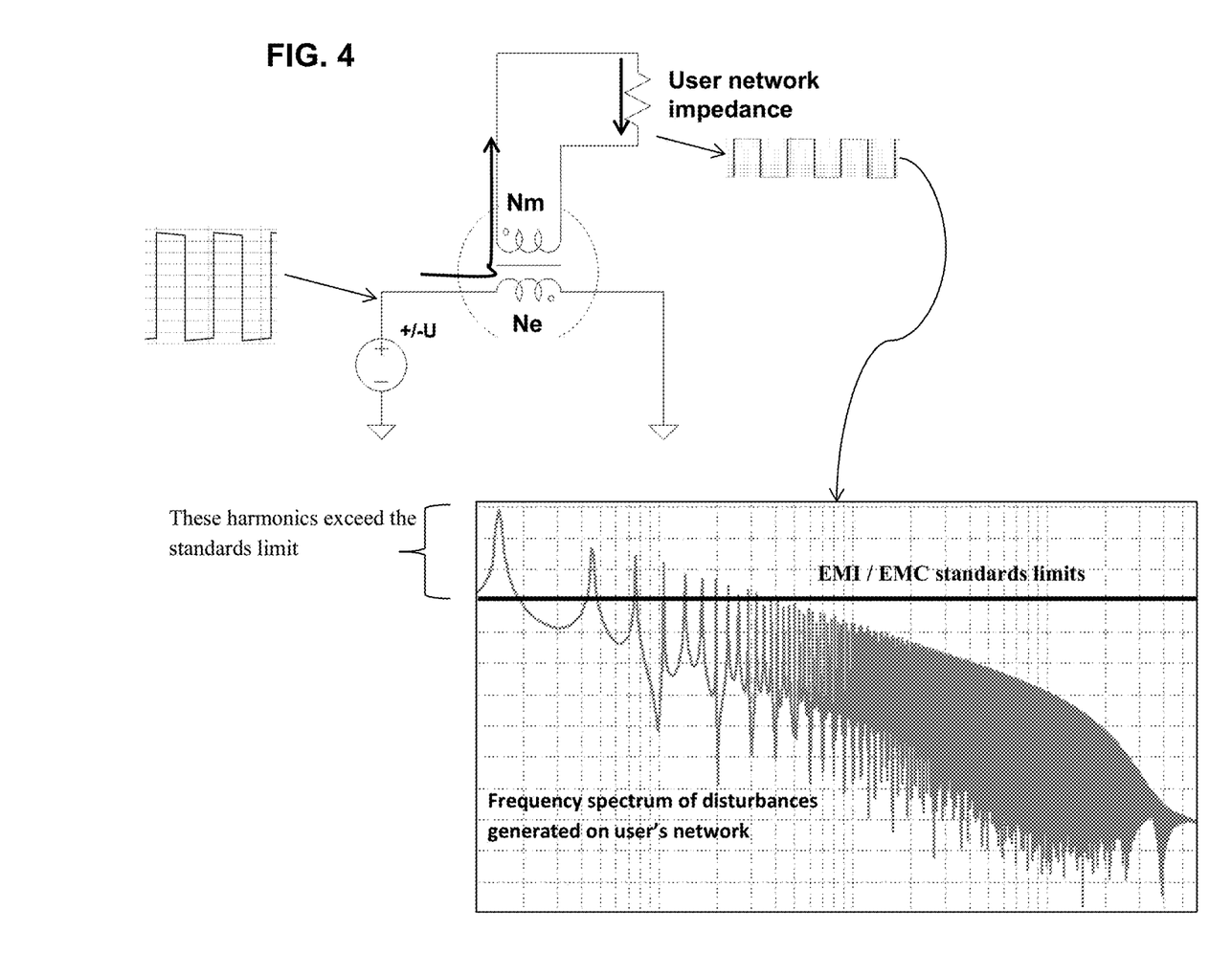
FIG. 4 schematically illustrates a frequency spectrum of a measurement output of conventional fluxgate current transducer connected to a user network.

As best illustrated in FIG. 4, the excitation signal applied on the excitation coil generates noise on the user network connected to the compensation or measuring coil, whereby in certain circumstances these disturbances have magnitudes that exceed standards for electromagnetic and electromagnetic compatibility (EMI/EMC). The noise may be reduced by reducing the amplitude of the alternating voltage applied on the excitation coil, however this also affects the measurement accuracy by increasing that noise to signal ratio of the measurement output.

In view of the foregoing, an object of the invention is to provide a fluxgate current transducer, and a method of operating a fluxgate current transducer, that has a high measurement signal to noise ratio yet that generates low electromagnetic interference when the current transducer is connected to a user network. In particular the electromagnetic interference should be below a threshold corresponding to electromagnetic interference and electromagnetic compatibility standards (EMI/EMC standards).

It is advantageous to provide a fluxgate current transducer that is cost effective and reliable.

It is advantageous to provide a fluxgate current transducer that is easy to install and operate.

Objects of the invention have been achieved by providing a fluxgate current transducer according to claim 1 and method of operating a fluxgate current transducer according to claim 10.

Disclosed herein is a fluxgate current transducer including a fluxgate device comprising a saturable soft magnetic core and an excitation coil, and a processing circuit comprising a control circuit and a voltage generator connected to the control circuit for generating an alternating current in the excitation coil, the voltage generator generating a voltage oscillating between a maximum positive voltage (+Umax) and a maximum negative voltage (−Umax) configured to alternatingly saturate the soft magnetic core. The control circuit is configured to generate a voltage having an absolute value of amplitude less than an absolute value of said maximum positive voltage (+Umax) and said maximum negative voltage (−Umax) voltage during a variable time window (Tn, Tn+1, Tn+2, Tn+3) after detection of the excitation coil current reaching a threshold current (S3) representative of saturation of the magnetic core during at least a subset of a plurality of alternating voltage periods (P).

Compared to conventional solutions, the variable time windows advantageously have the effect of spreading harmonics in order to reduce the EMI noise and thus allows the current transducer to have an increased measurement signal to noise ratio yet that generates low electromagnetic interference.

In an advantageous embodiment, the control circuit is configured to generate a set voltage that is substantially constant during the variable time window.

In an advantageous embodiment, the set voltage is zero or a non-zero voltage of absolute value less than 50% of the absolute value of said maximum voltage (+Umax, −Umax).

In an advantageous embodiment, the control circuit is configured to produce at least one variable time window per alternating excitation voltage period.

In an advantageous embodiment, the variable time window occurs at every half alternating voltage period (P).

In another embodiment, the variable time window is configured to occur intermittently over a plurality of periods.

In an advantageous embodiment, the voltage set during the variable time window is substantially constant.

In another embodiment, the voltage set during the variable time window is non-constant.

In an advantageous embodiment, the control circuit is provided in a field programmable gate array (FPGA). In other embodiments, the control circuit may also be provided in a microprocessor, microcontroller or ASIC.

Also disclosed herein is a method of operating a fluxgate current transducer including a fluxgate device comprising a saturable soft magnetic core and an excitation coil, and a processing circuit comprising a control circuit and a voltage generator connected to the control circuit for generating an alternating current in the excitation coil, the voltage generator generating a voltage oscillating between a maximum positive voltage (+Umax) and a maximum negative voltage (−Umax) configured to alternatingly saturate the soft magnetic core. The control circuit generates a voltage having an absolute value of amplitude less than an absolute value of said maximum positive voltage (+Umax) and said maximum negative voltage (−Umax) voltage during a variable time window (Tn, Tn+1, Tn+2, Tn+3) after detection of the excitation coil current reaching a threshold current (S3) representative of saturation of the magnetic core during at least a subset of a plurality of alternating voltage periods (P).

In an advantageous embodiment, the control circuit generates a set voltage that is substantially constant during the variable time window.

In an advantageous embodiment, the set voltage is zero or a non-zero voltage of absolute value less than 50% of the absolute value of said maximum voltage (+Umax, −Umax).

In an advantageous embodiment, the control circuit produces at least one variable time window per alternating excitation voltage period.

In an advantageous embodiment, the variable time window occurs at every half alternating voltage period (P).

In another embodiment, the variable time window occurs intermittently over a plurality of periods.

Further objects and advantageous features of the invention will be apparent from the claims, from the detailed description, and annexed drawings, in which:

Figure 5:
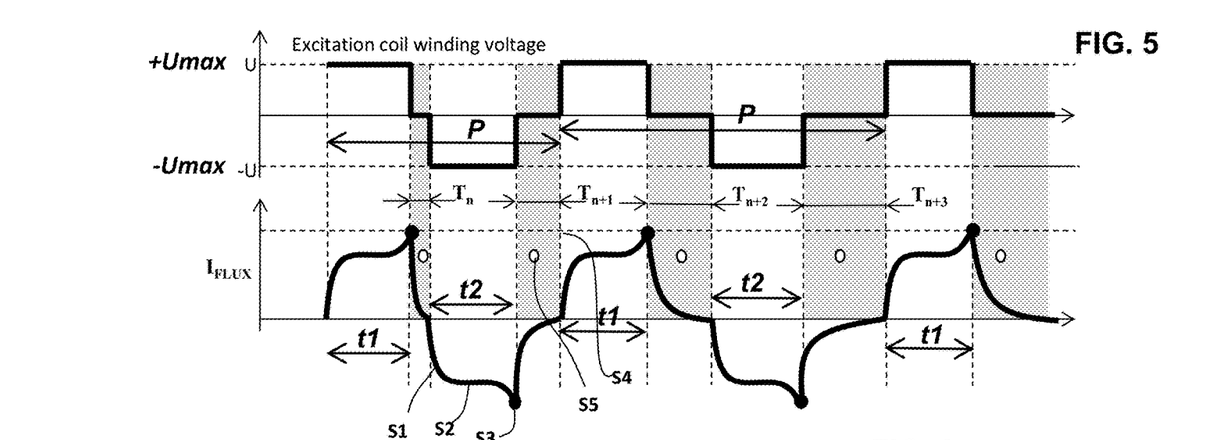
FIG. 5 shows plots of voltage, respectively current, over time in an excitation coil of a fluxgate current transducer according to an embodiment of the invention.
Figure 6:
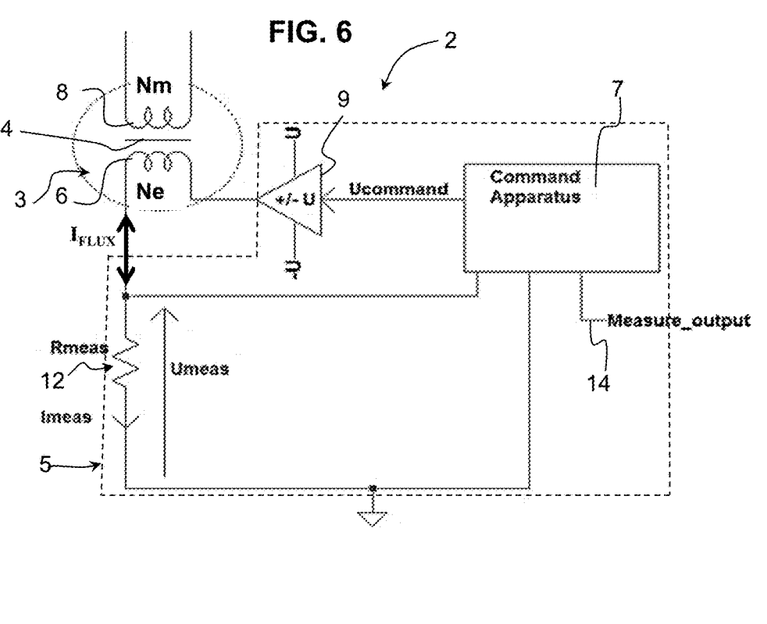
FIG. 6 shows a schematic circuit diagram of a fluxgate current transducer according to an embodiment of the invention.

Referring to FIGS. 5 and 6, a fluxgate current transducer 2 according to an embodiment of the invention comprises a magnetic field detector in a form of a fluxgate measuring head 3, and a signal processing circuit 5 connected to the fluxgate measuring head.

The fluxgate measuring head 3 may have various configurations per se known in the field of fluxgate magnetic field detectors, such configurations comprising at least a saturable soft magnetic core 4 and an excitation coil 6 wound around the magnetic core with Ne windings.

The fluxgate current transducer may further comprise a compensation coil with Nm windings 8 that magnetically couples to the excitation coil 6 and saturable soft magnetic core 4. The compensation coil 8 may be connected in a feed back loop to the processing circuit 5 in order to generate a magnetic field that seeks to cancel the magnetic field generated by a primary conductor carrying a current to be measured. The principle of the aforedescribed closed loop fluxgate transducer is per se well known and need not be described in detail herein.

In an alternative embodiment, the fluxgate current transducer may be an open loop transducer without a compensation coil in which case the coupling between the excitation coil 6 and saturable soft magnetic core 4 couples directly to a measurement coil 8 which may pass directly through the central passage of the magnetic core and excitation coil or may have a plurality of windings represented by the number Nm.

The processing circuit 5 comprises a command or control circuit 7 and a voltage generator 9.

The control circuit 7 comprises a voltage control output 10 that controls the voltage generator 9 in order to produce an alternating voltage signal for the excitation coil. The processing circuit further comprises an excitation coil measurement circuit 12 and a transducer measurement output 14 that outputs a measurement signal for a user. The measurement signal output by the control circuit represents a value of the primary current flowing in a primary conductor that the transducer aims to measure.

The general circuit layout as illustrated in embodiment of FIG. 6 is per se known, and other per se known fluxgate circuit layouts may be used within the scope of this invention. According to the invention, the control circuit 7 is however configured to generate a voltage output command signal to the voltage generator 9 that comprises a latency Tn, Tn+1, Tn+2, Tn+3, in the voltage signal between reversals of voltage at the end of a semi fluxgate period (cycle).

The processing circuit 5 may for instance be implemented in an FPGA (Field Programmable Gate Array) as per se well known in the field of signal processing circuits. In other embodiments the processing circuit 5 may also be implemented in a microprocessor, microcontroller or ASIC (Application Specific Integrated Circuit).

As best seen in FIG. 5, when the voltage is switched to a maximum amplitude of +Umax or −Umax during an initial stage S1 the current Iflux in the excitation coil rises until the magnetic core 4 goes into saturation during the stage S2 until it reaches a threshold detected by the control circuit 7. From this threshold point S3, the control circuit inserts a variable time window Tn, Tn+1, Tn+2, Tn+3 where the voltage is switched off to a value zero or set at a non-zero value that is between the maximum amplitude values +Umax and −Umax output by the voltage generator 9.

In the illustrated example of FIG. 5, the voltage during the variable time window after each semi fluxgate period (each semi cycle) is set to zero. Within the scope of invention, according to variants, it is possible to have more than one voltage level set during the variable time window or even a changing voltage within the variable time window, provided that the absolute value of the voltage remains less than the absolute value of the maximum voltages +Umax and −Umax generated by the voltage generator, preferably less than 50%.

As best seen in FIG. 5, the variable time window with the zero or non-zero intermediate voltage has at least two different times over a plurality of cycles (also named herein periods P). In the illustrated embodiment, the time window Tn in a first half cycle of the excitation voltage signal is different from the time window Tn+1 of a second time window of the other half cycle fluxgate signal, the first and second half cycles forming a period P. During the variable time window between switching from a maximum voltage to a maximum voltage of opposite sign, the measurement of time is disregarded (ignored or removed) from the current signal used for measurement of the external magnetic field. Thus, in order to provide a measurement of the external magnetic field that is an image of the primary current to be measured or for control of the compensation current, only the time of the half cycles t1 and t2 during a period P that do not include the variable time windows are used in the computation of the current measurement output.

Figure 7:
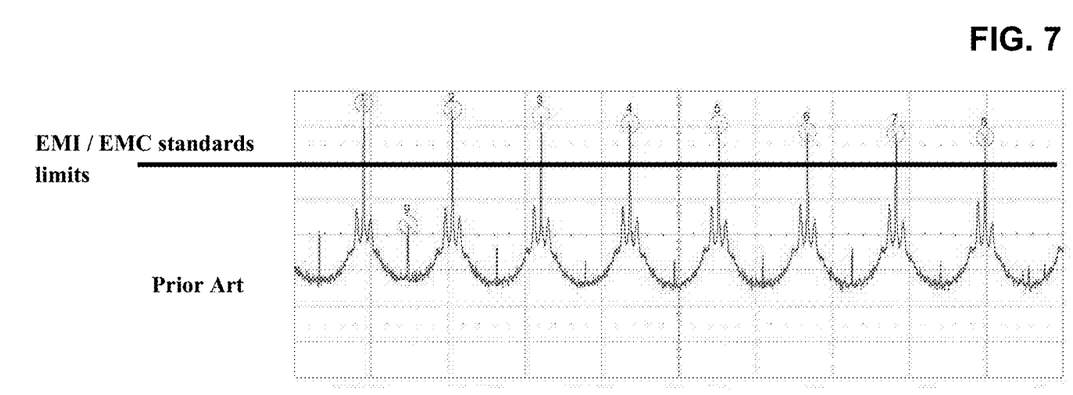
FIG. 7 illustrates an amplitude of EMI noise over time output by a conventional fluxgate current transducer connected to a user network.
Figure 8:
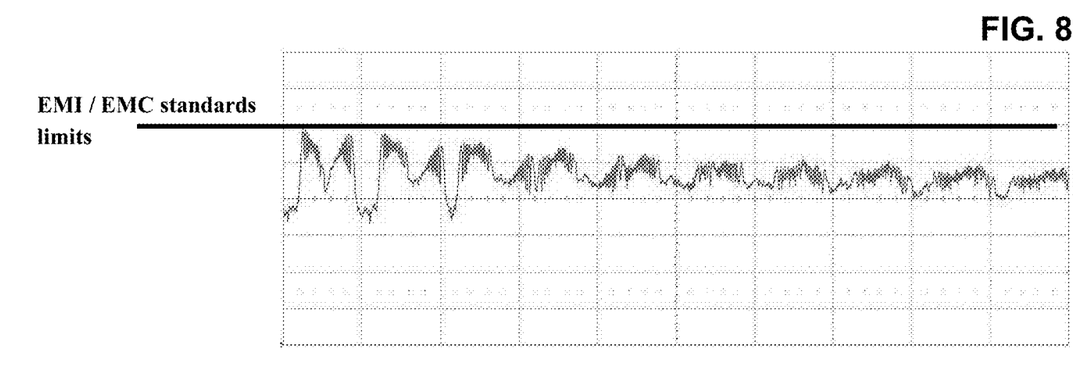
FIG. 8 illustrates an amplitude of EMI noise over time output by a fluxgate current transducer according to an embodiment of the invention connected to a user network.

The zero or non-zero voltages applied during the variable time windows Tn, Tn+1, Tn+2, Tn+3 advantageously have the effect of significantly reducing EMI noise as illustrated in FIG. 7 showing noise emitted by a fluxgate current transducer according to an embodiment of the invention compared to noise generated by a conventional fluxgate current transducer as illustrated in FIG. 6.

Preferably, there are more than two different variable time windows Tn, Tn+1, Tn+2, Tn+3 used over a plurality of periods, in other words having more than two different times, whereby the variable time windows have the effect of spreading harmonics in order to reduce the EMI noise. Although the illustrated embodiment in FIG. 5 shows a variable time window for each half period of an alternating voltage cycle, within the scope of the invention it is possible to have only one variable time window with a reduced voltage amplitude per period P, or even provided intermittently, for instance only every second or third period P.

Figure 5A:
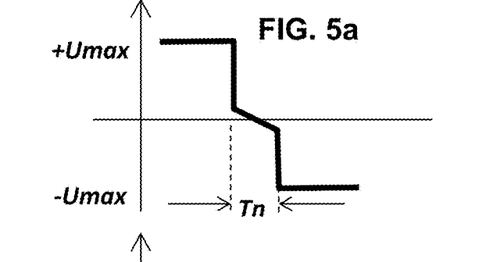
FIGS. 5a and 5b illustrate schematically other embodiments of excitation coil voltages of a fluxgate current transducer according to an embodiment of the invention.
Figure 5B:
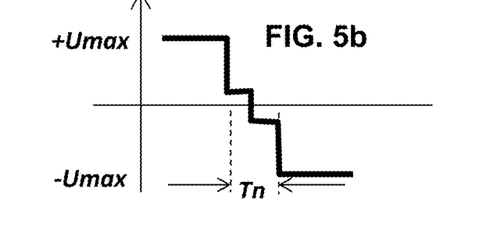

As illustrated in FIGS. 5, 5a and 5b, the voltage during the variable time window Tn may be constant (FIG. 5) or may be stepped (FIG. 5b) or may vary (FIG. 5a), provided that the voltage during the variable time window has an absolute amplitude below the absolute amplitudes of the maximum values +Umax and −Umax, preferably less than 50% of the maximum value.

For simplicity of the circuit, a preferred embodiment however is to have a single set constant voltage, preferably at zero volts, during the variable time window Tn, Tn+1, Tn+2, Tn+3.

LIST OF FEATURES

Fluxgate current transducer 2
Fluxgate device 3
Saturable soft magnetic core 4
Excitation coil (Ne winding) 6
Compensation coil or measurement coil (Nm winding) 8
Processing circuit 5
Command circuit 7
Voltage control output 10
Excitation coil measurement circuit 12
Measurement resistor Rmeas
Transducer measurement output 14
Voltage generator 9
Excitation coil current Imeas

The invention claimed is:

1. A fluxgate current transducer including a fluxgate device comprising a saturable soft magnetic core and an excitation coil, and a processing circuit comprising a control circuit and a voltage generator connected to the control circuit for generating an alternating current in the excitation coil, the voltage generator generating a voltage applied in the excitation coil oscillating between a maximum positive voltage (+Umax) and a maximum negative voltage (−Umax) configured to alternatingly saturate the soft magnetic core, wherein the control circuit is configured to generate a voltage applied in the excitation coil having an absolute value of amplitude less than an absolute value of said maximum positive voltage (+Umax) and said maximum negative voltage (−Umax) during a variable time window (Tn, Tn+1, Tn+2, Tn+3) after detection of the excitation coil current reaching a threshold current (S3) representative of saturation of the magnetic core during a plurality of alternating voltage periods (P) said variable time window having a succession of different durations over said plurality of alternating voltage periods (P).

2. The current transducer according to claim 1, wherein the control circuit is configured to generate a set voltage applied in the excitation coil that is substantially constant during the variable time window.

3. The current transducer according to claim 2, wherein the set voltage is zero or a non-zero voltage of absolute value less than 50% of the absolute value of said maximum voltage (+Umax, −Umax).

4. The current transducer according to claim 1, wherein the control circuit is configured to produce at least one variable time window per alternating excitation voltage period.

5. The current transducer according to claim 4, wherein the variable time window occurs at every half alternating voltage period (P).

6. The current transducer according to claim 1, wherein the variable time window is configured to occur intermittently over a plurality of periods.

7. The current transducer according to claim 1, wherein the voltage set during the variable time window is substantially constant.

8. The current transducer according to claim 1, wherein the voltage set during the variable time window is non-constant.

9. The current transducer according to claim 1, wherein the control circuit is provided in any of a field programmable gate array (FPGA), microprocessor, microcontroller or ASIC.

10. A method of operating a fluxgate current transducer including a fluxgate device comprising a saturable soft magnetic core and an excitation coil, and a processing circuit comprising a control circuit and a voltage generator connected to the control circuit for generating an alternating current in the excitation coil, the voltage generator generating a voltage applied in the excitation coil oscillating between a maximum positive voltage (+Umax) and a maximum negative voltage (−Umax) configured to alternatingly saturate the soft magnetic core, wherein the control circuit generates a voltage applied in the excitation coil having an absolute value of amplitude less than an absolute value of said maximum positive voltage (+Umax) and said maximum negative voltage (−Umax) during a successively variable time window (Tn, Tn+1, Tn+2, Tn+3) after detection of the excitation coil current reaching a threshold current (S3) representative of saturation of the magnetic core during a plurality of alternating voltage periods (P), said variable time window having a succession of different durations over said plurality of alternating voltage periods (P).

11. The method according to claim 10, wherein the control circuit generates a set voltage applied in the excitation coil that is substantially constant during the variable time window.

12. The method according to claim 11, wherein the set voltage is zero or a non-zero voltage of absolute value less than 50% of the absolute value of said maximum voltage (+Umax, −Umax).

13. The method according to claim 10, wherein the control circuit produces at least one variable time window per alternating excitation voltage period.

14. The method according to claim 13, wherein the variable time window occurs at every half alternating voltage period (P).

15. The method according to claim 10, wherein the variable time window occurs intermittently over a plurality of periods.

* * * * *